(12) United States Patent
Hirao et al.

(10) Patent No.: US 12,374,701 B2
(45) Date of Patent: Jul. 29, 2025

(54) CELL STACK DEVICE, MODULE, MODULE HOUSING DEVICE, AND CONDUCTIVE MEMBER

(71) Applicant: KYOCERA Corporation, Kyoto (JP)

(72) Inventors: Kazuki Hirao, Aira (JP); Takeshi Kozai, Yokohama (JP); Tetsuro Fujimoto, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 542 days.

(21) Appl. No.: 17/797,380

(22) PCT Filed: Feb. 25, 2021

(86) PCT No.: PCT/JP2021/007224
§ 371 (c)(1),
(2) Date: Aug. 3, 2022

(87) PCT Pub. No.: WO2021/172481
PCT Pub. Date: Sep. 2, 2021

(65) Prior Publication Data
US 2023/0044104 A1 Feb. 9, 2023

(30) Foreign Application Priority Data
Feb. 28, 2020 (JP) ................ 2020-034268

(51) Int. Cl.
*H01M 8/0215* (2016.01)
*H01M 8/021* (2016.01)
(Continued)

(52) U.S. Cl.
CPC ........ *H01M 8/0215* (2013.01); *H01M 8/021* (2013.01); *H01M 8/0228* (2013.01);
(Continued)

(58) Field of Classification Search
None
See application file for complete search history.

(56) References Cited

U.S. PATENT DOCUMENTS 8,865,373 B2  10/2014  Inoue et al.
9,325,019 B2   4/2016  Fujimoto et al.
(Continued)

FOREIGN PATENT DOCUMENTS

WO  2009/131180 A1  10/2009
WO  2011/105578 A1   9/2011
(Continued)

*Primary Examiner* — Jonathan Crepeau
(74) *Attorney, Agent, or Firm* — Procopio, Cory, Hargreaves & Savitch LLP

(57) ABSTRACT

A cell stack device includes at least one cell and at least one conductive member. The cell includes an element portion. The conductive member includes a base member containing chromium, a first layer containing an oxide containing zinc, and a zinc spinel portion located at the interface between the base member and the first layer. The first layer includes a first region facing the element portion. A first overlap area ratio, at which the zinc spinel portion located at a first interface between the first region and the base member overlaps with the first interface, is less than a second overlap area ratio, at which the zinc spinel portion located at a second interface between a second region where the surface of the first layer is exposed to an oxidizing atmosphere and the base member overlaps with the second interface.

8 Claims, 10 Drawing Sheets

(51) Int. Cl.
  *H01M 8/0228* (2016.01)
  *H01M 8/12* (2016.01)
  *H01M 8/243* (2016.01)
  *H01M 8/2475* (2016.01)
  *C23C 14/08* (2006.01)
  *C23C 28/04* (2006.01)

(52) U.S. Cl.
  CPC ............ *H01M 8/12* (2013.01); *H01M 8/243* (2013.01); *H01M 8/2475* (2013.01); *C23C 14/08* (2013.01); *C23C 28/042* (2013.01)

(56) References Cited

U.S. PATENT DOCUMENTS

| | | |
|---|---|---|
| 9,935,320 B2 | 4/2018 | Fujimoto et al. |
| 10,361,440 B2 | 7/2019 | Sato et al. |

FOREIGN PATENT DOCUMENTS

| | | |
|---|---|---|
| WO | 2013/077445 A1 | 5/2013 |
| WO | 2016/152924 A1 | 9/2016 |

CELL STACK DEVICE, MODULE, MODULE HOUSING DEVICE, AND CONDUCTIVE MEMBER

CROSS-REFERENCE TO RELATED APPLICATIONS

This application is the U.S. National Stage Application under 35 U.S.C § 371 of International Application No. PCT/JP2021/007224, filed on Feb. 25, 2021, designating the United States, and published as WO/2021/172481 on Sep. 2, 2021, which claims the benefit of priority from Japanese Patent Application No. 2020-034268, filed on Feb. 28, 2020. Any and all applications for which a foreign or a domestic priority is claimed is/are identified in the Application Data Sheet filed herewith and is/are hereby incorporated by reference in their entirety under 37 C.F.R. § 1.57.

TECHNICAL FIELD

The present disclosure relates to a cell stack device, a module, a module housing device, and a conductive member.

BACKGROUND ART

In recent years, various fuel cell stack devices including a plurality of fuel cells have been proposed as next generation energy sources. A fuel cell is a type of cell capable of obtaining electrical power using a fuel gas such as hydrogen-containing gas and oxygen-containing gas such as air.

In such a fuel cell stack device, a plurality of cells are electrically connected in series by current collection members made of an alloy containing Cr, for example.

CITATION LIST

Patent Literature

Patent Document 1: WO 2009/131180

SUMMARY OF INVENTION

A cell stack device according to one aspect of an embodiment includes at least one cell and at least one conductive member. The cell includes an element portion. The conductive member includes a base member containing chromium, a first layer containing an oxide containing zinc, and a zinc spinel portion located at an interface between the base member and the first layer. The first layer includes a first region facing the element portion. A first surface area ratio, at which the zinc spinel portion located at a first interface between the first region and the base member overlaps with the first interface, is less than a second surface area ratio, at which the zinc spinel portion located at a second interface between a second region where the surface of the first layer is exposed to an oxidizing atmosphere and the base member overlaps with the second interface.

Additionally, the module of the present disclosure includes the cell stack device described above, and a housing container for housing the cell stack device.

A module housing device of the present disclosure includes the module described above, an auxiliary device for operating the module, and an external case housing the module and the auxiliary device.

The conductive member of the present disclosure includes a base member containing chromium, a first layer containing an oxide containing zinc, and a zinc spinel portion located at the interface between the base member and the first layer. The first layer includes a first region and a second region. A first surface area ratio, at which the zinc spinel portion located at a first interface between the first region and the base member overlaps with the first interface, is less than a second surface area ratio, at which the zinc spinel portion located at a second interface between the second region and the base member overlaps with the second interface.

DESCRIPTION OF EMBODIMENTS

Embodiments of a cell stack device, a module, a module housing device, and a conductive member disclosed in the present application will now be described in detail with reference to the accompanying drawings. This disclosure is not limited by the following embodiments.

In addition, it should be noted that the drawings are schematic, and the relationship between the dimensions of each element, the ratio of each element, or the like may differ from reality. In addition, there may be differences between the drawings in the dimensional relationships, proportions, or the like.

Configuration of Cell

First, referring to FIGS. 1A to 1C, an example of a solid oxide fuel cell will be described as a cell constituting a cell stack device according to an embodiment.

Figure 1A:
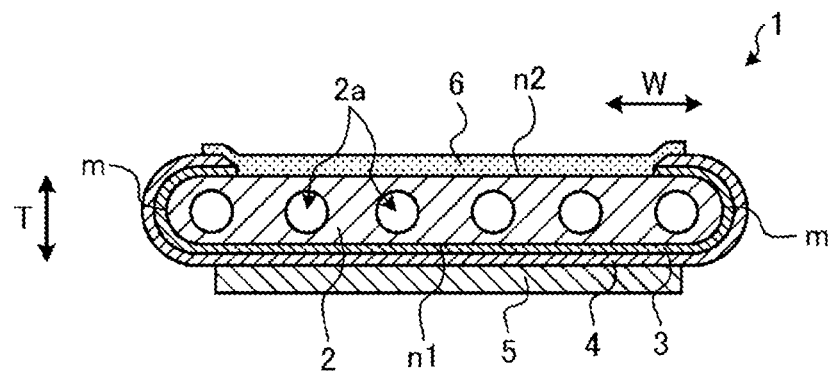
FIG. 1A is a horizontal cross-sectional view illustrating an example of a cell according to an embodiment.

FIG. 1A is a horizontal cross-sectional view illustrating an example of a cell 1 according to an embodiment. FIG. 1B is a side view illustrating an example of the cell 1 according to the embodiment as viewed from an air electrode 5 side. FIG. 1C is a side view illustrating an example of the cell 1 according to the embodiment as viewed from an interconnector 6 side. FIGS. 1A to 1C are enlarged views of a part of each configuration of the cell 1.

Figure 1B:
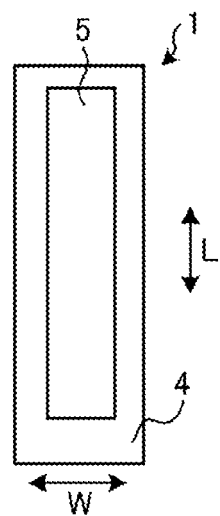
FIG. 1B is a side view illustrating an example of the cell according to the embodiment as viewed from an air electrode side.
Figure 1C:
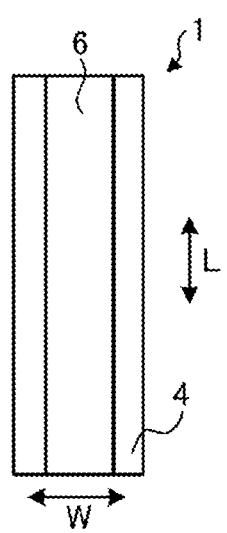
FIG. 1C is a side view illustrating an example of the cell according to the embodiment as viewed from an interconnector side.

In the example illustrated in FIGS. 1A to 1C, the cell 1 has a hollow flat and elongated plate. As illustrated in FIG. 1B, the overall shape of the cell 1 as viewed from the side surface is, for example, a rectangle in which the length direction L has a side length of 5 cm to 50 cm and the width direction W orthogonal to the length direction L has a length of 1 cm to 10 cm. The overall thickness of the cell 1 in the thickness direction T ranges from 1 mm to 5 mm.

As illustrated in FIG. 1A, the cell 1 includes a conductive support substrate 2, a power generating element, and an interconnector 6. The support substrate 2 is columnar with a pair of opposing flat surfaces n1 and n2, and a pair of circular arc shape side surfaces m connecting the flat surfaces n1 and n2.

The power generating element is provided on the flat surface n1 of the support substrate 2. The power generating element includes a fuel electrode 3, a solid electrolyte layer 4, and an air electrode 5. In the example illustrated in FIG. 1A, the interconnector 6 is provided on the flat surface n2.

Also, as illustrated in FIG. 1B, the air electrode 5 does not extend to the lower end of the cell 1. At the lower end of the cell 1, only the solid electrolyte layer 4 is exposed to the surface. As illustrated in FIG. 1C, the interconnector 6 extends to the lower end of the cell 1. At the lower end of the cell 1, the interconnector 6 and the solid electrolyte layer 4 are exposed on the surface. As illustrated in FIG. 1A, the solid electrolyte layer 4 is exposed on the surface of a pair of circular arc shape side surfaces m of the cell 1.

Hereinafter, each of the components constituting the cell 1 will be described.

The support substrate 2 includes an internal gas-flow passage 2a through which gas flows. The example of the support substrate 2 illustrated in FIG. 1A includes six gas-flow passage 2a. The support substrate 2 has gas permeability, and transmits the fuel gas flowing in the gas-flow passage 2a to the fuel electrode 3. The support substrate 2 may have conductivity. The conductive support substrate 2 is also a current collector for collecting the electricity generated in the power generating element to the interconnector 6.

The material of the support substrate 2 contains, for example, an iron group metal component and an inorganic oxide. For example, the iron group metal component may be Ni (nickel) and/or NiO. The inorganic oxide may be, for example, a specific rare earth element oxide.

Generally known materials can be used for the fuel electrode 3. As the fuel electrode 3, porous conductive ceramics, for example, ceramics containing $ZrO_2$ in which calcium oxide, magnesium oxide, or rare earth element oxide is in a solid solution, and Ni and/or NiO, may be used. As the rare earth element oxide, for example, $Y_2O_3$ or the like is used. $ZrO_2$ in which calcium oxide, magnesium oxide, or rare earth element oxide is in a solid solution is sometimes called stabilized zirconia. The stabilized zirconia also includes partially stabilized zirconia.

The solid electrolyte layer 4 is the electrolyte, which bridges the ions between the fuel electrode 3 and the air electrode 5. At the same time, the solid electrolyte layer 4 has a gas blocking property to prevent leakage between the fuel gas and the oxygen-containing gas.

The material of the solid electrolyte layer 4 may be, for example, $ZrO_2$ in which 3 mol % to 15 mol % of a rare earth element oxide is in a solid solution. As the rare earth element oxide, for example, $Y_2O_3$ or the like is used. It should be noted that other materials may be used for the material of the solid electrolyte layer 4 as long as the material has the above characteristics.

The material of the air electrode 5 is not particularly limited as long as it is generally used for the air electrode. The material of the air electrode 5 may be, for example, conductive ceramics such as a perovskite oxide of the so-called $ABO_3$ type.

The material of the air electrode 5 may be, for example, a composite oxide in which Sr and La coexist at the A site. Examples of such composite oxides include $La_xSr_{1-x}Co_yFe_{1-y}O_3$, $La_xSr_{1-x}MnO_3$, $La_xSr_{1-x}FeO_3$, $La_xSr_{1-x}CoO_3$, or the like. Here, x is 0<x<1 and y is 0<y<1.

The air electrode 5 has gas permeability. The open porosity of the air electrode 5 may be, for example, 20% or more, particularly in the range from 30% to 50%.

As the material of the interconnector 6, a lanthanum chromite-based perovskite oxide ($LaCrO_3$-based oxide), a lanthanum strontium titanium-based perovskite-type oxide ($LaSrTiO_3$-based oxide), or the like may be used. These materials are electrically conductive and are not reduced or oxidized even in contact with a fuel gas such as a hydrogen-containing gas and an oxygen-containing gas such as air.

Further, the interconnector 6 is dense and less prone to cause leakage of a fuel gas flowing through a gas-flow passage 2a located within the support substrate 2 and an oxygen-containing gas flowing outside the support substrate 2. The interconnector 6 may have a relative density of 93% or more, particularly 95% or more.

Configuration of Cell Stack Device

Figure 2A:
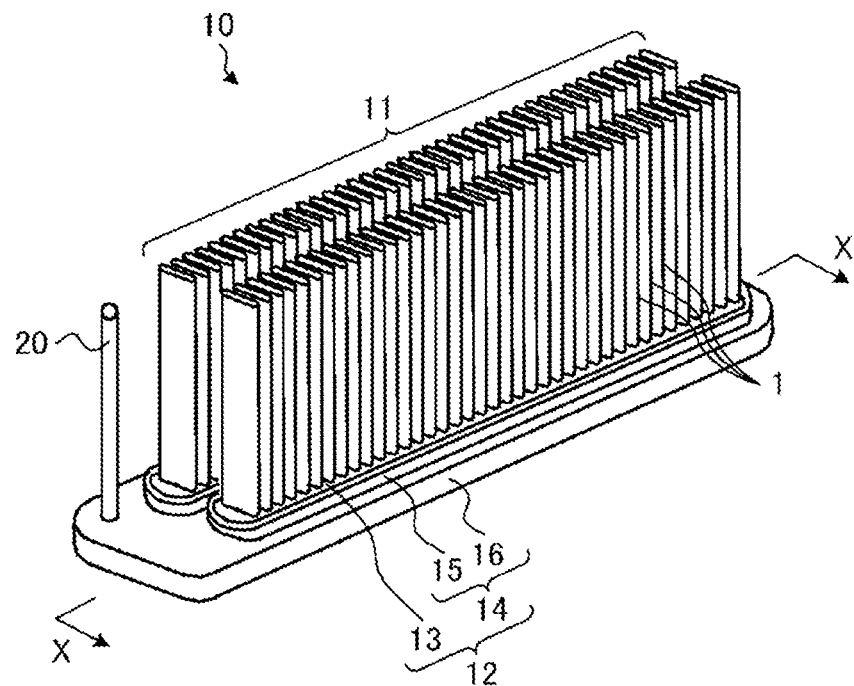
FIG. 2A is a perspective view illustrating an example of a cell stack device according to an embodiment.
Figure 2B:
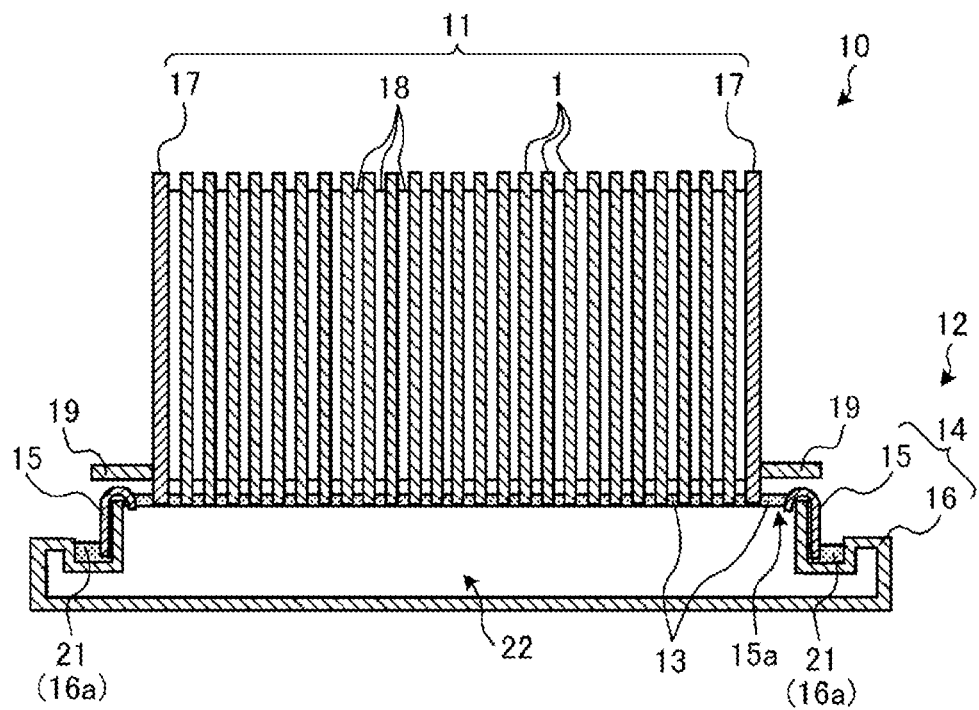
FIG. 2B is a cross-sectional view taken along a line X-X illustrated in FIG. 2A.
Figure 2C:
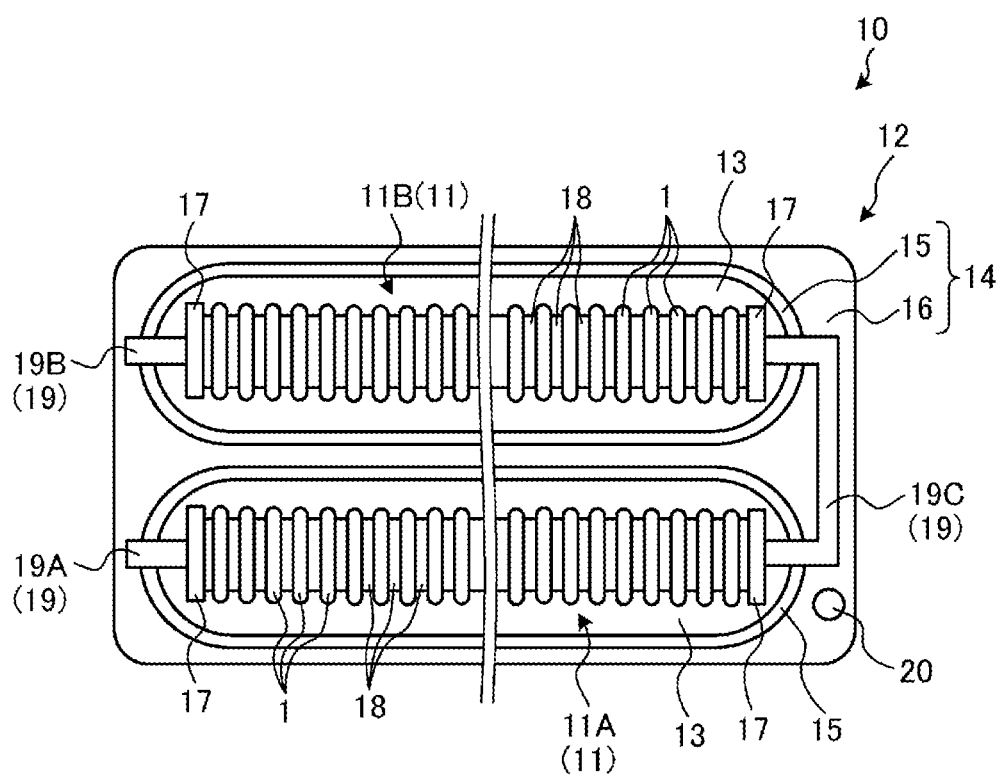
FIG. 2C is a top view illustrating an example of the cell stack device according to the embodiment.

Next, a cell stack device 10 according to the present embodiment using the cell 1 mentioned above will be described with reference to FIGS. 2A to 2C. FIG. 2A is a perspective view illustrating an example of a cell stack device 10 according to the embodiment. FIG. 2B is a cross-sectional view taken along a line X-X illustrated in FIG. 2A. FIG. 2C is a top view illustrating an example of the cell stack device 10 according to an embodiment.

As illustrated in FIG. 2A, the cell stack device 10 includes a cell stack 11 including a plurality of cells 1 arranged (stacked) in a thickness direction T (see FIG. 1A) of the cell 1, and a fixing member 12. The cell stack 11 may include at least one cell 1. When only one cell 1 is included, the term "a cell stack 11" or "a cell stack device 10" may be used for the sake of simplicity.

The fixing member 12 includes a fixing material 13 and a support member 14. The support member 14 supports the cell 1. The fixing material 13 fixes the cell 1 to the support member 14. The support member 14 includes a support body 15 and a gas tank 16. The support body 15 and the gas tank 16, as the support member 14, are made of metal and electrically conductive.

As illustrated in FIG. 2B, the support body 15 includes an insertion hole 15a into which the lower ends of the plurality of cells 1 are inserted. The lower ends of the plurality of cells 1 and the inner wall of the insertion hole 15a are joined by a fixing material 13.

The gas tank 16 includes an opening for supplying a reactive gas to the plurality of cells 1 through the insertion hole 15a, and a recessed groove 16a located around the opening. The outer peripheral end portion of the support body 15 is joined to the gas tank 16 by a jointing material 21 with which the recessed groove 16a of the gas tank 16 is filled.

In the example illustrated in FIG. 2A, a fuel gas is stored in an internal space 22 formed by the support body 15 and the gas tank 16, which constitute the support member 14. A gas flow pipe 20 is connected to the gas tank 16. A fuel gas is supplied to the gas tank 16 through the gas flow pipe 20, and supplied from the gas tank 16 to the gas-flow passage 2a (see FIG. 1A) inside the cell 1. The fuel gas supplied to the gas tank 16 is generated by a reformer 102 (see FIG. 10) described later.

A hydrogen-rich fuel gas can be produced by, for example, steam reforming the raw fuel. When the fuel gas is produced by steam reforming, the fuel gas contains steam.

The example illustrated in FIG. 2A includes two rows of cell stacks 11, two support bodies 15, and the gas tank 16. Two rows of cell stacks 11 each have a plurality of cells 1. Each cell stack 11 is fixed to each support body 15. The gas tank 16 includes two through holes on its upper surface. Each support body 15 is disposed in each through hole. The internal space 22 is formed by one gas tank 16 and two support bodies 15.

The shape of the insertion hole 15a has, for example, an oval shape in a top surface view. The insertion hole 15a is configured, for example, to have a length in the array direction or thickness direction T of the cell 1 is greater than the distance between the two end current collectors 17 located at the both ends of the cell stack 11. The width of the insertion hole 15a is, for example, greater than the length in the width direction W of the cell 1 (see FIG. 1A).

As illustrated in FIG. 2B, the joined portions between the inner wall of the insertion hole 15a and the lower ends of the cells 1 are filled with the fixing material 13 and solidified. Thus, the inner wall of the insertion hole 15a and each of the lower ends of the plurality of cells 1 are joined and fixed, and the lower ends of the cells 1 are joined and fixed to each other. The gas-flow passage 2a of each cell 1, at its lower end, communicates with the internal space 22 of the support member 14.

The fixing material 13 and the jointing material 21 may be made of a material having low conductivity such as glass. As the specific materials of the fixing material 13 and the jointing material 21, amorphous glass or the like may be used, and especially, crystallized glass or the like may be used.

As the crystallized glass, for example, any of $SiO_2$—CaO-based, $MgO$—$B_2O_3$-based, $La_2O_3$—$B_2O_3$—MgO-based, $La_2O_3$—$B_2O_3$—ZnO-based, and $SiO_2$—CaO—ZnO-based materials may be used, or particularly, a $SiO_2$—MgO-based material may be used.

Also, as illustrated in FIG. 2B, conductive members 18 are each interposed between the adjacent cells 1 among the plurality of cells 1. The conductive member 18 electrically connects in series the fuel electrode 3 of one adjacent cell 1 and the air electrode 5 of the other adjacent cell 1. More specifically, the interconnector 6 electrically connected to the fuel electrode 3 of the one adjacent cell 1 is connected to the air electrode 5 of the other adjacent cell 1. The conductive member 18 connected to the adjacent cells 1 will be described in detail later.

As illustrated in FIG. 2B, the end current collector 17 is electrically connected to each of the outermost cells 1 in the array direction of the plurality of cells 1. The end current collectors 17 are each connected to a conductive portion 19 protruding outside the cell stack 11. The conductive portions 19 collect and draw out the electricity generated due to power generation by the cells 1. In FIG. 2A, the end current collectors 17 are not illustrated.

As illustrated in FIG. 2C, in the cell stack device 10, two cell stacks 11A and 11B are connected in series and function as one battery. Therefore, a conductive portion 19 of the cell stack device 10 is divided into a positive terminal 19A, a negative terminal 19B, and a connection terminal 19C.

The positive terminal 19A is a positive electrode for outputting the electrical power generated by the cell stack 11 to the outside, and is electrically connected to the end current collector 17 on the positive electrode side in the cell stack 11A. The negative terminal 19B is a negative electrode for outputting the electrical power generated by the cell stack 11 to the outside, and is electrically connected to the end current collector 17 on the negative electrode side in the cell stack 11B.

The connection terminal 19C electrically connects the end current collector 17 on the negative electrode side in the cell stack 11A and the end current collector 17 on the positive electrode side in the cell stack 11B.

Details of Conductive Member

Figure 3:
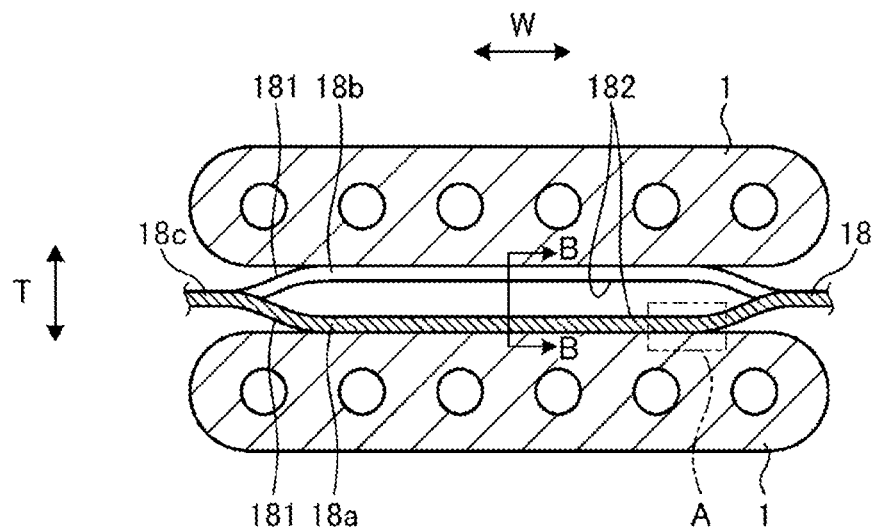
FIG. 3 is a horizontal cross-sectional view illustrating an example of a conductive member according to an embodiment.

Next, the conductive member 18 according to an embodiment will be described in detail with reference to FIG. 3. FIG. 3 is a horizontal cross-sectional view illustrating an example of a conductive member according to an embodiment.

As illustrated in FIG. 3, the conductive member 18 includes a joined portion 18a joined to one of the adjacent cells 1 and a joined portion 18b joined to the other adjacent cell 1. Moreover, the conductive member 18 includes the connecting portion 18c at both ends in the width direction W to connect the joined portions 18a and 18b. This allows the conductive member 18 to connect the adjacent cells 1 to each other in the thickness direction T. In FIG. 3, the shape of the cell 1 is illustrated by simplification.

The joined portions 18a and 18b each include a first surface 181 facing the cell 1 and a second surface 182 facing the joined portion 18b or 18a. The conductive member 18 will be further described below with reference to FIG. 4.

Figure 4:
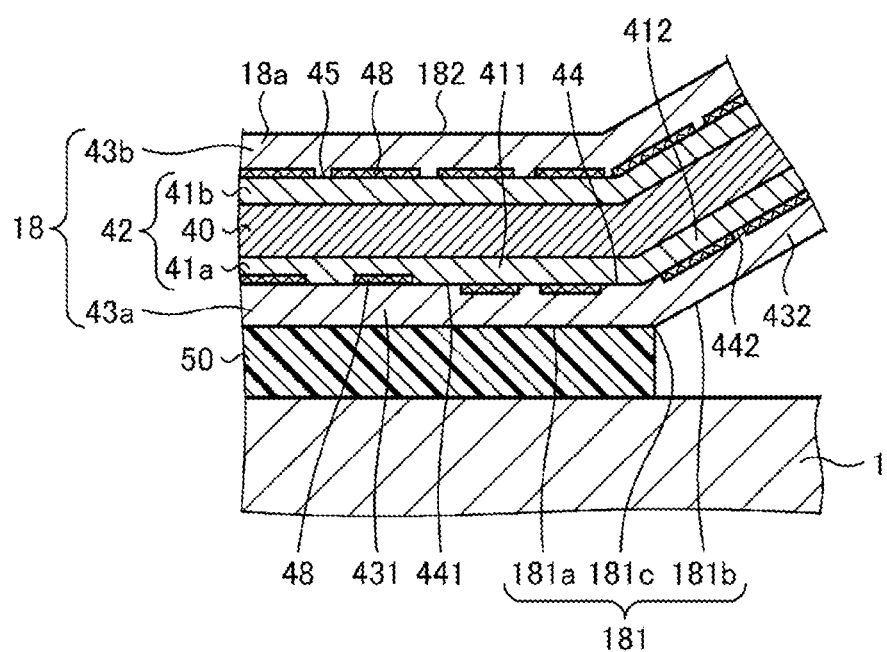
FIG. 4 is an enlarged view of a region A illustrated in FIG. 3.

FIG. 4 is an enlarged view of a region A illustrated in FIG. 3. The conductive member 18 (joined portion 18a) may be joined to the element portion of the cell 1 via a jointing material 50. The element portion includes the power generating element, the current collector and the interconnector 6, described above. As illustrated in FIG. 4, the jointing material 50 is located between a contact surface 181a of a first surface 181 and the element portion of the cell 1, and may join the conductive member 18 and the element portion of the cell 1. The jointing material 50 has conductivity and thermal resistance, and conduction between the cells 1 through the conductive member 18 is appropriately performed. The jointing material 50 is, for example, an adhesive that is bonded to the interconnector 6. The jointing material 50 may also be, for example, a jointing material that is bonded to the air electrode 5 of the cell 1. The element portion may include a jointing material 50.

The conductive member 18 includes a base member 42, covering layers 43a and 43b, and a zinc spinel portion 48. The base member 42 has conductivity and thermal resistance. The base member 42 contains chromium. The base member 42 is, for example, stainless steel. The base member 42 may contain, for example, a metal oxide.

Further, the base member 42 may also have a layered structure. In the example illustrated in FIG. 4, the base member 42 includes a base layer 40 and intermediate layers 41*a* and 41*b*. The intermediate layers 41*a* and 41*b* contain, for example, chromium oxide ($Cr_2O_3$). The intermediate layers 41*a* and 41*b* are examples of a second layer. Thus, the intermediate layers 41*a* and 41*b* are positioned between the base member 42 and the covering layers 43*a* and 43*b*, thereby increasing the durability of the conductive member 18. The base member 42 may not include the intermediate layers 41*a* and 41*b*. Moreover, the base member 42 may also include a further layered structure.

The covering layers 43*a* and 43*b* cover the base member 42. The covering layer 43*a* is located between the base member 42 and the cell 1, that is, on the first surface 181 side of the conductive member 18. The covering layer 43*b* is located opposite the covering layer 43*a* across the base member 42, that is, on the second surface 182 side of the conductive member 18. The covering layers 43*a* and 43*b* are examples of a first layer.

The covering layers 43*a* and 43*b* contain an oxide containing zinc. The oxide containing zinc is, for example, $ZnCr_2O_4$. The covering layers 43*a* and 43*b* may be, for example, $ZnMnCoO_4$. The covering layers 43*a* and 43*b* may also contain other elements such as Fe, Co and Al.

Further, the covering layer 43*a* includes regions 431 and 432. The region 431 is a portion facing the element portion of the cell 1. More specifically, the region 431 is a portion between the contact surface 181*a* in the first surface 181, which contacts the jointing material 50, and an interface 441, which is roughly parallel to the contact surface 181*a*, at the interface 44 between the base member 42 and the covering layer 43*a*. The region 432 is a portion between an exposed surface 181*b*, which is exposed on an oxidizing atmosphere, such as air, for example, in the first surface 181, and the interface 442, which is roughly parallel to the exposed surface 181*b* at the interface 44. The region 431 is an example of a first region. The region 432 is an example of a second region. The first region may be referred to as a region in electrical contact with the cell 1 or the jointing material 50.

The zinc spinel portion 48 is located at the interface 44 between the base member 42 and the covering layer 43*a*, and at the interface 45 between the base member 42 and the covering layer 43*b*. "Located at the interfaces 44 and 45" means that the zinc spinel portion 48 exists in the cross-section along the interfaces 44 and 45. The zinc spinel portion 48 may be located either on the base member 42 side, or on the covering layers 43*a* and 43*b* side. The zinc spinel portion 48 may be located in a manner that the interfaces 44 and 45 are sandwiched to across both the base member 42, as well as, the covering layers 43*a* and 43*b*.

The zinc spinel portion 48 contains $ZnAl_2O_4$. The zinc spinel portion 48 may contain $Al_2O_3$. By locating the zinc spinel portion 48 at the interfaces 44 and 45, the diffusion of Cr contained in the base member 42 is reduced. On the other hand, as the content of the zinc spinel portion 48 increases, the electric resistance as the conductive member 18 increases and the battery performance decreases.

Therefore, in the embodiment, the conductive member 18 includes a region where Cr is hard to diffuse because the conductive member 18 contacts the cell 1 via the jointing material 50, that is, faces the element portion of the cell 1, and a region where Cr is easy to diffuse because the conductive member 18 is exposed to the oxidizing atmosphere. Here, it is configured that a surface area ratio at which the zinc spinel portion 48 located in the region where Cr is hard to diffuse overlaps with the interfaces 44 and 45 is less than a surface area ratio at which the zinc spinel portion 48 located in the region where Cr is easy to diffuse, overlaps with the interfaces 44 and 45. For example, in an embodiment, the surface area ratio at which the zinc spinel portion 48 overlaps with the interface 441 is less than the surface area ratio at which the zinc spinel portion 48 overlaps with the interface 442. The interface 441 is an example of a first interface. The interface 442 is an example of a second interface.

Thus, the increase in electric resistance due to the presence of the zinc spinel portion 48 can be suppressed. Therefore, according to the embodiment, the performance of the conductive member 18 can be enhanced, making it possible to reduce a decrease in the battery performance of the cell stack device 10.

Here, the surface area ratios at which the zinc spinel portion 48 overlaps with the interfaces 441 and 442 can be calculated as follows. First, the cross-section of the conductive member 18 is polished, and elemental analysis of the interface 44 and its vicinity is performed using high-angle annular dark-field scanning transmission electron microscopy (HAADF-STEM) (JEM-ARM 200F manufactured by JEOL Ltd.) and energy dispersive X-ray spectroscopy (EDS). It is considered that $ZnAl_2O_4$ exists in the position where Zn (zinc) and Al (aluminum) are simultaneously detected by elemental analysis. Furthermore, Al element mapping of the interface 44 and its vicinity is performed at a multiplication factor of 3000 times, an acceleration voltage of 200 kV, and a maximum luminance of 100 to obtain an Al element mapping image. Next, the detection strength of Al in the Al element mapping image is calculated in 256 gradations using analysis software Igor from HULINKS Inc. With the threshold value of the strength being 60, a portion having the strength of 60 or more is regarded as a zinc spinel portion 48, and the presence or absence thereof is determined. By repeating and averaging the above process for a plurality of times within a predetermined surface area, the surface area ratio at which the zinc spinel portion 48 overlaps with the interfaces 441 and 442 can be calculated.

The surface area ratio (first surface area ratio) at which the zinc spinel portion 48 located at the interface 441 overlaps with the interface 441 may be, for example, 10 area % or more and 50 area % or less. Thus, the increase of electric resistance can be suppressed.

On the other hand, the surface area ratio (second surface area ratio) at which the zinc spinel portion 48 located at the interface 442 overlaps with the interface 442 may be, for example, 50 area % or more, or 100 area %. However, the second surface area ratio is not particularly limited as long as it is greater than the first surface area ratio.

The surface area ratio at which the zinc spinel portion 48 overlaps with the interface 45 can also be measured and calculated in the same manner as the surface area ratio of the zinc spinel portion 48 at the interface 44 described above. Such a surface area ratio at the interface 45 is greater than the first surface area ratio. Thus, diffusion of Cr from the second surface 182 side can be reduced. Therefore, a decrease in the battery performance of the cell stack device 10 can be reduced. Such a surface area ratio at the interface 45 is an example of the second surface area ratio. The surface area ratios at the interface 442 and at the interface 45 may be the same or different from each other.

In the above description, the joined portion 18*a* of the conductive member 18 has been described as an example, but the joined portion 18*b* is also the same, and a detailed description thereof is omitted.

Moreover, in FIG. 4, the regions 431 and 432 are partitioned at the interface portion 181c between the contact surface 181a and the exposed surface 181b, but are not limited thereto, and an intermediate region (not illustrated) may be included between, for example, the region 431 and the region 432. In such a case, at the interface 44 located in the intermediate region, for example, the zinc spinel portion 48 having the same surface area ratio as that at the interface 441 may be located, or the zinc spinel portion 48 having the same surface area ratio as that at the interface 442 may be located. Further, at the interface 44 located in the intermediate region, for example, the zinc spinel portion 48 having the intermediate surface area ratio between that at the interface 441 and that at the interface 442, may be located.

Further, in the above description, although the conductive member 18 has been described as having a layered structure including the covering layer 43a, the intermediate layer 41a, the base layer 40, the intermediate layer 41b, and the covering layer 43b, the present disclosure is not limited thereto. For example, each of the intermediate layers 41a and 41b may be an intermediate layer 41 that sequentially covers the periphery of the base layer 40. Additionally, the covering layers 43a and 43b may be a covering layer 43 that continuously covers the periphery of the base member 42. Hereinafter, the conductive member 18 having the intermediate layer 41 and the covering layer 43 will be further described with reference to FIGS. 5 and 6.

Figure 5:
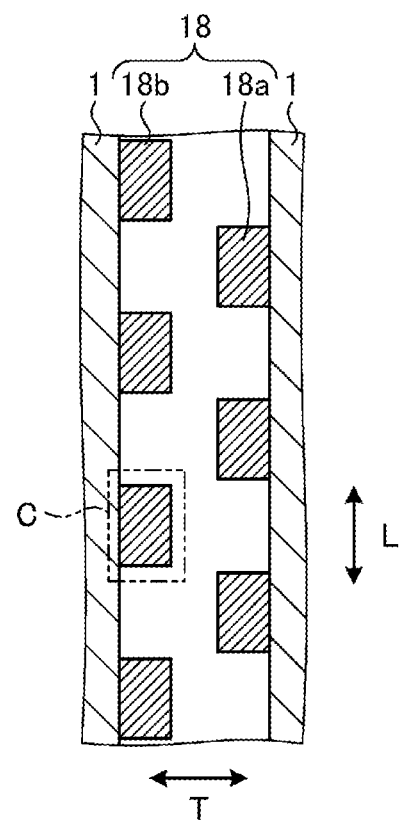
FIG. 5 is a cross-sectional view taken along a line B-B illustrated in FIG. 3.
Figure 6:
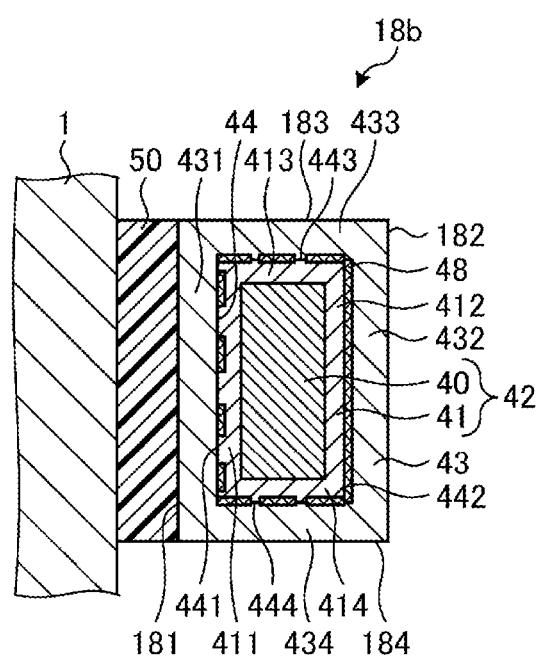
FIG. 6 is an enlarged view of a region C illustrated in FIG. 5.

FIG. 5 is a cross-sectional view taken along a line B-B illustrated in FIG. 3. FIG. 6 is an enlarged view of a region C illustrated in FIG. 5.

The conductive member 18 extends in the length direction L of the cell 1. As illustrated in FIG. 5, a plurality of joined portions 18a and 18b of the conductive member 18 are alternately located along the length direction L of the cell 1. The conductive member 18 contacts the cell 1 at each of the joined portions 18a and 18b.

Further, as illustrated in FIG. 6, the conductive member 18 (joined portion 18b) is joined to the cell 1 via the jointing material 50. The jointing material 50 is located between the first surface 181 of the conductive member 18 and the cell 1, and joins the conductive member 18 and the cell 1.

The conductive member 18 includes a base member 42, a covering layer 43, and a zinc spinel portion 48. Moreover, the base member 42 includes a base layer 40 and an intermediate layer 41.

The covering layer 43 covers the base member 42 over the thickness direction T and the length direction L of the cell 1. The covering layer 43 is an example of the first layer.

Further, the covering layer 43 includes regions 431 to 434. The region 431 is a portion facing the element portion of the cell 1. More specifically, the region 431 is a portion between the first surface 181 and the interface 441 which is located, of the interface 44 between the base member 42 and the covering layer 43, between the first surface 181 and the base member 42. The regions 432 to 434 are portions between the second surface 182 to the fourth surface 184 and the interfaces 442 to 444, respectively, which are located, of the interface 44, between the second surface 182 to the fourth surface 184 and the base member 42.

The zinc spinel portion 48 is located at the interface 44, that is, located at each of the interfaces 441 to 444. Here, in the embodiment, the surface area ratio at which the zinc spinel portion overlaps with the interface 441 as the first interface is less than the surface area ratio at which the zinc spinel portion 48 overlaps with the interfaces 442 to 444 as the second interface.

Thus, the increase in electric resistance due to the presence of the zinc spinel portion 48 can be suppressed. Therefore, according to the embodiment, the performance of the conductive member 18 can be enhanced, making it possible to reduce a decrease in the battery performance of the cell stack device 10.

The surface area ratio at which the zinc spinel portion 48 located at the interface 441 overlaps with the interface 441 may be, for example, 10 area % or more and 50 area % or less. Thus, the increase of electric resistance can be suppressed.

On the other hand, the surface area ratio at which the zinc spinel portion 48 located at the interface 442 to the interface 444 overlaps with the interface 442 to the interface 444 may be, for example, 50 area % or more, or 100 area %. However, the surface area ratio is not particularly limited as long as it is greater than the surface area ratio of the zinc spinel portion 48 overlapping with the interface 441. Such surface area ratios may be the same or different from each other.

In the above description, the joined portion 18b of the conductive member 18 has been described as an example, but the joined portion 18a is also the same, and a detailed description thereof is omitted.

Figure 7:
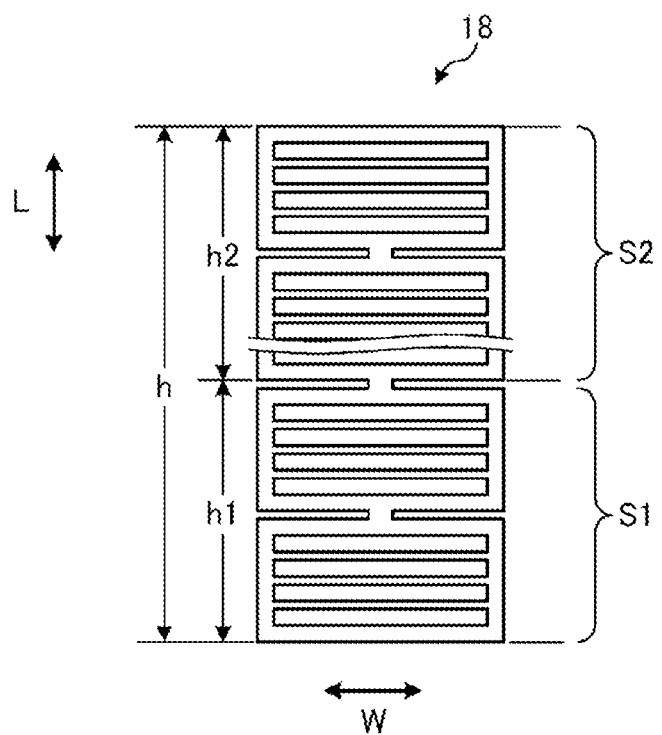
FIG. 7 is a plan view illustrating an example of a conductive member according to an embodiment.

FIG. 7 is a plan view illustrating an example of a conductive member according to an embodiment. As illustrated in FIG. 7, the conductive member 18 extends in the length direction L of the cell 1. The conductive member 18 includes a first part S1 close to an air inflow opening (not illustrated) and a second part S2 close to an air outflow opening.

Here, the surface area ratio at which the zinc spinel portion 48 (see FIG. 6) located at the interface 44 (see FIG. 6) overlaps with the interface 44 may be greater in the second part S2 than in the first part 51.

The current tends to be greater, as compared to the air inflow opening side, at the air outflow opening side, where the temperature tends to be higher than at the air inflow opening side. Therefore, by making the surface area ratio at which the zinc spinel portion 48 overlaps with the interface 44 in the second part S2 greater than that in the first part S1, for example, the deviation of the current can be reduced.

Further, the thickness in the direction intersecting the interface 44 of the zinc spinel portion 48 (see FIG. 6) located at the interface 44 (see FIG. 6) may be greater in the second part S2 than in the first part S1.

Cr evaporates more easily, as compared to the air inflow opening, at the air outflow opening side where the temperature tends to be higher than at the air inflow opening side. Therefore, by making the thickness of the zinc spinel portion 48 in the second part S2 greater than that in the first part S1, for example, a defect caused by evaporation of Cr can be reduced.

Here, the ratio (h1:h2) of the length h1 of the first part S1 to the length h2 of the second part S2 with respect to the total length h of the conductive member 18 located in the length direction L of the cell 1 may be 1:5 to 5:1, for example.

The conductive member 18 may be interposed between the outermost cell 1 in the array direction of the plurality of cells 1 and the end current collector 17 to electrically connect the outermost cell 1 and the end current collector 17. In this case, for example, "the other cell 1" of the adjacent cells 1 in the above description may be replaced with "the end current collector 17", and "the portion facing the element portion of the cell 1" may be replaced with "the portion facing the end current collector 17".

Module

Figure 8:
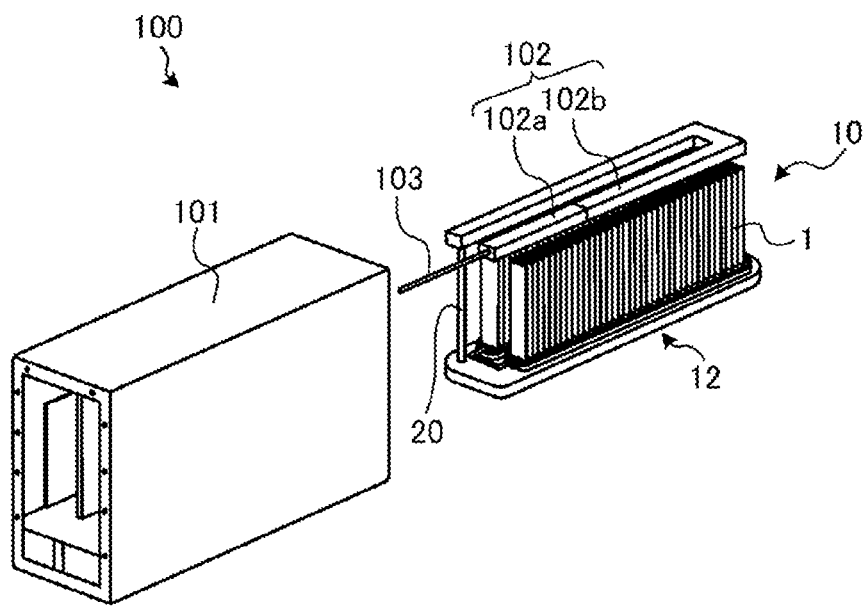
FIG. 8 is an exterior perspective view illustrating an example of a module according to an embodiment.

Next, a module 100 according to the embodiment of the present disclosure using the cell stack device 10 mentioned above will be described with reference to FIG. 8. FIG. 8 is an exterior perspective view illustrating a module according to an embodiment, and illustrates a state in which the front and rear surfaces that are part of the housing container 101 are removed and the cell stack device 10 of the fuel cell stored therein is taken out rearward.

As illustrated in FIG. 8, the module 100 is configured to house a cell stack device 10 in a housing container 101. A reformer 102 for generating a fuel gas to be supplied to the cell 1 is disposed above the cell stack device 10.

In the reformer 102, fuel gas is generated by reforming raw fuel such as natural gas and kerosene, and supplied to the cell 1. The raw fuel is supplied to the reformer 102 through the raw fuel supply pipe 103. The reformer 102 may include a vaporizing unit 102a for vaporizing water and a reforming unit 102b. The reforming unit 102b includes a reforming catalyst (not illustrated) for reforming the raw fuel into a fuel gas. Such a reformer 102 can perform steam reforming which is an efficient reformation reaction.

The fuel gas generated by the reformer 102 is supplied to the gas-flow passage 2a (see FIG. 1A) of the cell 1 through the gas flow pipe 20, the gas tank 16, and the fixing member 12.

In the module 100 having the configuration mentioned above, the temperature in the module 100 during normal power generation is about 500° C. to 1000° C. due to combustion of gas and power generation by the cell 1.

In such a module 100, as mentioned above, since the cell stack device 10 for reducing the deterioration of the battery performance is housed, the module 100 that reduces the decrease in the battery performance can be provided.

Module Housing Device

Figure 9:
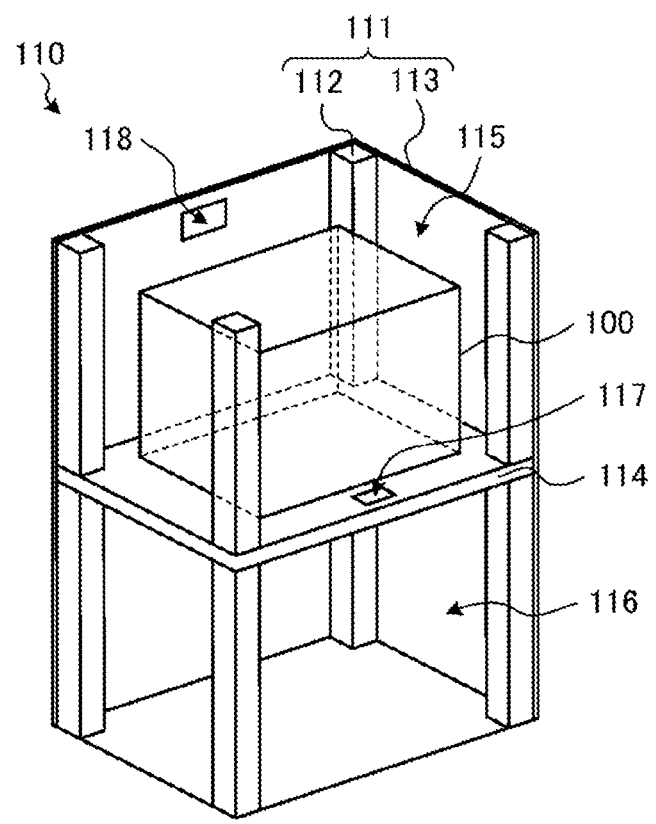
FIG. 9 is an exploded perspective view schematically illustrating an example of a module housing device according to an embodiment.

FIG. 9 is an exploded perspective view illustrating an example of a module housing device according to an embodiment. A module housing device 110 according to an embodiment includes an external case 111, a module 100 illustrated in FIG. 8, and an auxiliary device (not illustrated). The auxiliary device operates the module 100. The module 100 and the auxiliary device are contained within the external case 111. In FIG. 9, a partial configuration is omitted.

The external case 111 of the module housing device 110 illustrated in FIG. 9 includes a column 112 and an external plate 113. A dividing plate 114 vertically partitions the interior of the external case 111. The space above the dividing plate 114 in the external case 111 is a module housing room 115 that houses the module 100, and the space below the dividing plate 114 in the external case 111 is an auxiliary device housing room 116 that houses the auxiliary device that operates the module 100. In FIG. 9, the auxiliary device housed in the auxiliary device housing room 116 is omitted.

Additionally, the dividing plate 114 includes an air vent 117 for allowing the air to flow in the auxiliary device housing room 116 toward the module housing room 115. The external plate 113 constituting the module housing room 115 includes an exhaust opening 118 for exhausting air in the module housing room 115.

In such a module housing device 110, as mentioned above, since the module housing room 115 includes a module 100 for reducing the deterioration of the battery performance, the module housing device 110 that reduces the decrease in the battery performance can be provided.

Various Modified Examples

Next, the end current collector according to various modified examples of embodiments will be described with reference to FIGS. 10 to 13.

In the embodiment mentioned above, a so-called "vertically striped type", in which only one element portion including a fuel electrode, a solid electrolyte layer, and an air electrode is provided on the surface of the support substrate, has been exemplified. However, the present embodiment can be applied to a horizontally striped type cell stack device, in which a plurality of element portions are provided on the surface of a support substrate at mutually separated places, and so-called "horizontally striped type" cells in which adjacent element portions are electrically connected, are laminated.

Further, in the present embodiment, the case where the support substrate of the hollow flat plate type is used has been exemplified, but the present embodiment can also be applied to a cell stack device using the support substrate of the cylindrical type. Further, as will be described later, the present embodiment can be applied to a flat plate cell stack device in which the so-called "flat plate type" cells are laminated in the thickness direction.

In the above embodiment, the fuel electrode is provided on the support substrate and the air electrode is provided on the surface of the cell. Alternatively, the above embodiment can be applied to a cell stack device with the air electrode is provided on the support substrate and a fuel electrode is provided on the surface of the cell.

The "cell", the "cell stack device", the "module", and the "module housing device", which have been exemplified in the above embodiment by a fuel cell, a fuel cell stack device, a fuel cell module, and a fuel cell device, respectively, may also be exemplified by an electrolytic cell, an electrolytic cell stack device, an electrolytic module, and an electrolytic device, respectively.

Figure 10:
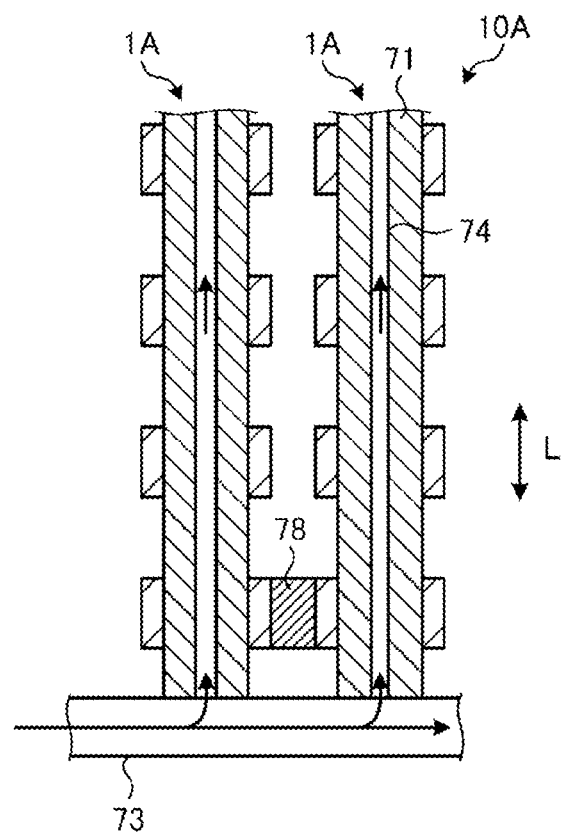
FIG. 10 is a cross-sectional view illustrating a cell according to a first modified example of an embodiment.
Figure 11:
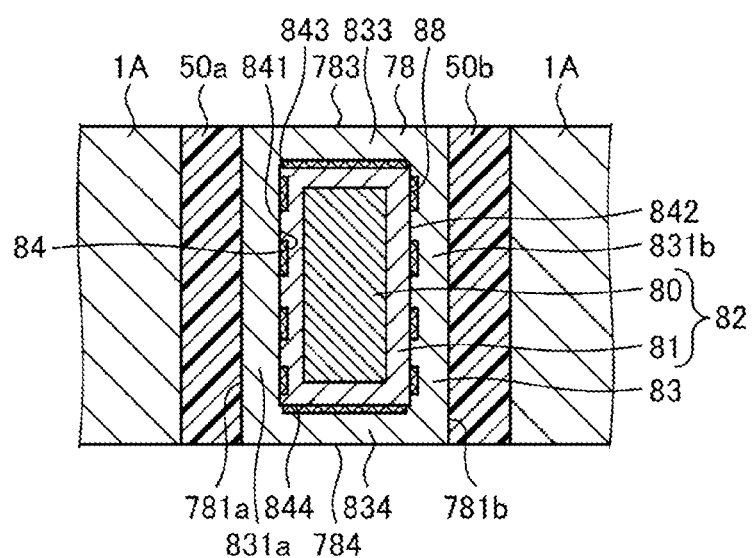
FIG. 11 is an enlarged cross-sectional view of a conductive member according to the first modified example of an embodiment.

FIG. 10 is a cross-sectional view illustrating a cell according to a first modified example of the embodiment. FIG. 11 is an enlarged cross-sectional view of a conductive member according to the first modified example of the embodiment. As illustrated in FIG. 10, a cell 1A includes a plurality of support substrates 71 extending in the length direction L from the pipe 73 through which a fuel gas flows. A gas-flow passage 74 through which a gas from the pipe 73 flows is provided inside the support substrate 71. The cells 1A are electrically connected to each other via a conductive member 78. The conductive member 78 is located between the element portions each included in each cell 1A and electrically connects adjacent cells 1A to each other. Specifically, the current collector or the interconnector electrically connected to the air electrode of the element portion of one of adjacent cells 1A and a current collector or the interconnector electrically connected to the fuel electrode of the other adjacent cell 1A are connected.

As illustrated in FIG. 11, the conductive member 78 is joined, via the jointing materials 50a and 50b, to each of the element portions of the cells 1A adjacent to each other. The jointing material 50a is located between the surface 781a of the conductive member 78 and one of the cells 1A, and joins the conductive member 78 and the one cell 1A. The jointing material 50b is located between the surface 781b of the conductive member 78 and the other of the cells 1A, and joins the conductive member 78 and the other cell 1A. The conductive member 78 may have, for example, a U-shaped or N-shaped cross-section in FIGS. 10 and 11.

The conductive member 78 includes a base member 82, a covering layer 83, and a zinc spinel portion 88. Further, the base member 82 includes a base layer 80 and an intermediate layer 81 as a second layer. Each portion of the conductive member 78 may be made of, for example, a material similar to that of the conductive member 18 described above. Also, the conductive member 78 may be made of a different material from the conductive member 18.

The covering layer 83 covers the base member 82 over the whole in the array direction and the length direction L of the cell 1A. The covering layer 83 is an example of the first layer.

The covering layer 83 includes regions 831a, 831b, 833, and 834. The regions 831a and 831b face the element portions of the different cells 1A, respectively. More specifically, the region 831a is a portion between the interface 841 which is located, at the interface 84 between the base member 82 and the covering layer 83, between the surface 781a and the base member 82, and the surface 781a. The region 831b is a portion between the interface 842 which is located, at the interface 84, between the surface 781b and the base member 82, and the surface 781b. The regions 833 and 834 are portions between the interfaces 843 and 844 which are located, at the interface 84, between the surfaces 783 and 784 and the base member 82, and the surfaces 783 and 784, respectively.

The zinc spinel portion 88 is located at the interface 84, that is, located at each of the interfaces 841 to 844.

The faces 783 and 784 of the covering layer 83 are exposed to an oxidizing atmosphere. On the other hand, the surfaces 781a and 781b are in contact with the cells 1A via the jointing materials 50a and 50b, respectively, and Cr is hardly diffused. Here, in the embodiment, the surface area ratio at which the zinc spinel portion 88 overlaps with the interfaces 841 and 842 as the first interface is less than the surface area ratio at which the zinc spinel portion 88 overlaps with the interfaces 843 and 844 as the second interface.

Thus, the increase in electric resistance due to the presence of the zinc spinel portion 88 can be suppressed. Therefore, according to the embodiment, the performance of the conductive member 78 can be enhanced, making it possible to reduce the decrease in the battery performance of the cell stack device 10A.

The surface area ratio at which the zinc spinel portion 88 located at the interfaces 841 and 842 overlaps with the interfaces 841 and 842, respectively, may be, for example, 10 area % or more and 50 area % or less. Thus, the increase of electric resistance can be suppressed. Each of the surface area ratios at the interfaces 841 and 842 may be the same or different from each other.

On the other hand, the surface area ratio at which the zinc spinel portion 88 located at the interfaces 843 and 844 overlaps with the interfaces 843 and 844, respectively, may be, for example, 50 area % or more, or 100 area %. However, the surface area ratio is not particularly limited as long as it is greater than the surface area ratio of the zinc spinel portion 88 overlapping with the interfaces 841 and 842. Each of the surface area ratios at the interfaces 843 and 844 may be the same or different from each other.

Figure 12:
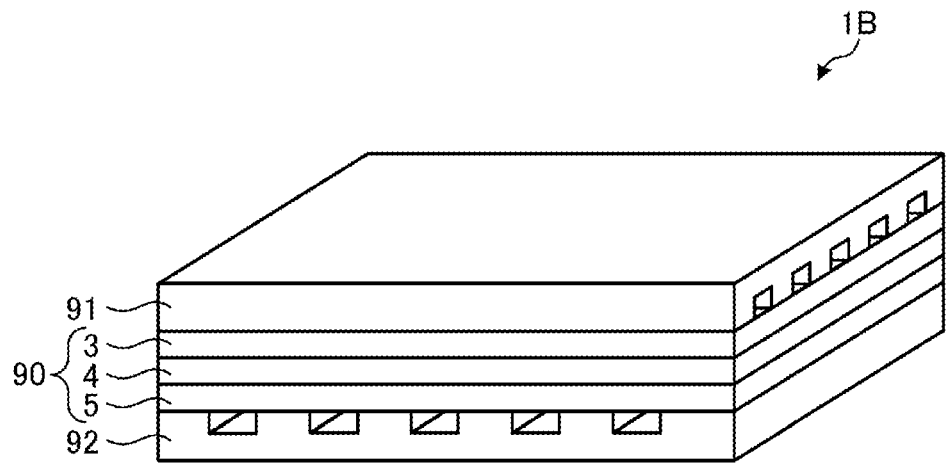
FIG. 12 is a perspective view illustrating a flat plate cell according to a second modified example of an embodiment.
Figure 13:
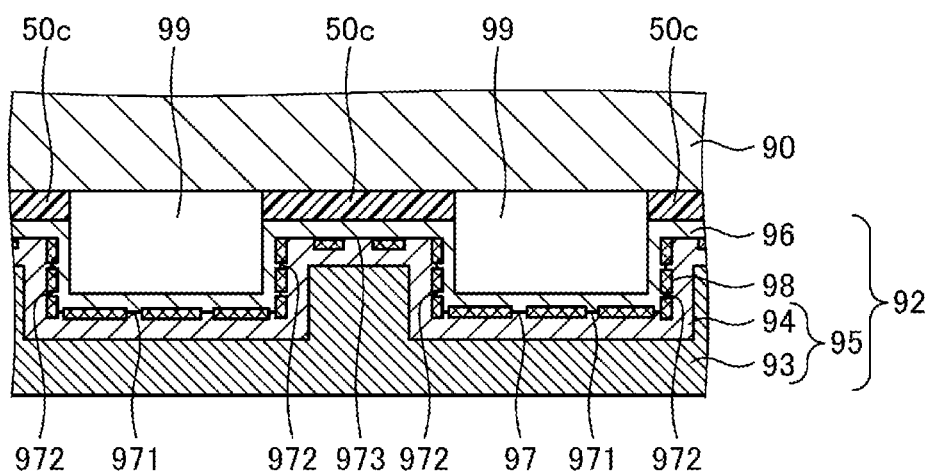
FIG. 13 is a partial cross-sectional view of the flat plate cell illustrated in FIG. 12.

FIG. 12 is a perspective view illustrating a flat plate cell according to a second modified example of an embodiment. FIG. 13 is a partial cross-sectional view illustrating a flat plate cell illustrated in FIG. 12.

As illustrated in FIG. 12, a cell 1B includes an element portion 90 in which the fuel electrode 3, the solid electrolyte layer 4, and the air electrode 5 are laminated. In a cell stack device in which a plurality of flat plate cells are laminated, for example, a plurality of cells 1B are electrically connected by the conductive members 91 and 92 which are metal layers each adjacent to the cells 1B. The conductive members 91 and 92 electrically connect the cells 1B adjacent to each other, and each include a gas-flow passage for supplying gas to the fuel electrode 3 or the air electrode 5.

As illustrated in FIG. 13, in the present modified example, the conductive member 92 includes a gas-flow passage 99 for supplying a gas to the air electrode 5. The conductive member 92 is joined to the element portion 90 (air electrode 5) via the jointing material 50c. Note that the conductive member 92 may be in direct contact with the element portion 90 (air electrode 5) through no jointing material 50c.

The conductive member 92 includes a base member 95, a covering layer 96, and a zinc spinel portion 98. Moreover, the base member 95 includes a base layer 93 and an intermediate layer 94 as a second layer. Each portion of the conductive member 92 may be made of, for example, a material similar to that of the conductive members 18 and 78 described above. Additionally, the conductive member 92 may be made of a material different from the conductive members 18 and 78.

The covering layer 96 covers the base member 95 over the entire area facing the gas-flow passage 99. The covering layer 96 is an example of the first layer.

The zinc spinel portion 98 is located at the interface 97 between the base member 95 and the covering layer 96. The interface 97 includes an interface 973 where the covering layer 96 is located in the region (first region) facing the element portion 90 via the jointing material 50c, and interfaces 971 and 972 where the covering layer 96 is located in the region (second region) facing the gas-flow passage 99 through which air flows. Here a surface area ratio of the zinc spinel portion 98 overlapping with the interface 973 is less than a surface area ratio of the zinc spinel portion 98 overlapping with the interfaces 971 and 972 at the interfaces 971 and 972. When the conductive member 92 directly contacts the element portion 90 (air electrode 5) through no jointing material 50c, the region where the covering layer 96 contacts the element portion 90 (air electrode 5) is defined as a first region.

Thus, the increase in electric resistance due to the presence of the zinc spinel portion 98 can be suppressed. Therefore, according to the embodiment, the performance of the conductive member 92 can be enhanced, making it possible to reduce a decrease in the battery performance of the cell stack device in which the cells 1B are laminated can be reduced.

The surface area ratio at which the zinc spinel portion 98 located at the interface 973 overlaps with the interface 973 may be, for example, 10 area % or more and 50 area % or less. Thus, the increase of electric resistance can be suppressed.

On the other hand, the overlap area ratio at which the zinc spinel portion 98 located at the interfaces 971 and 972 overlaps with each of the interfaces 971 and 972, may be, for example, 50 area % or more, or 100 area %. However, the overlap area ratio is not particularly limited as long as it is greater than the overlap area ratio of the zinc spinel portion 98 overlapping with the interfaces 973. The overlap area ratios at the interfaces 971 and 972 may be the same or different from each other.

Although the present disclosure has been described above in detail, the present disclosure is not limited to the embodiments mentioned above, and various changes, improvements, or the like can be made without departing from the gist of the present disclosure.

As described above, the cell stack device 10 according to the embodiment includes at least one cell 1 and at least one conductive member 18. The cell 1 includes an element portion. The conductive member 18 includes a base member 42 containing chromium, a first layer (covering layer 43) containing an oxide containing zinc, and a zinc spinel portion 48 located at the interface 44 between the base member 42 and the first layer. The first layer includes a first region (region 431) facing the element portion. A first surface area ratio, at which the zinc spinel portion 48 located at a first interface (interface 441) between the first region and the base member 42 overlaps with the first interface, is less than a second surface area ratio, at which the zinc spinel portion 48 located at a second interface (interface 442) between a second region (region 432) where the surface of the first layer is exposed to an oxidizing atmosphere and the base member 42 overlaps with the second interface. This can reduce a decrease in the battery performance of the cell stack device 10.

The module 100 according to the embodiment includes the cell stack device 10 described above, and a housing container 101 for housing the cell stack device 10. Thus, the module 100 can be used to reduce the decrease in the battery performance.

The module housing device 110 according to the embodiment includes the module 100 described above, an auxiliary device for operating the module 100, and an external case 111 for housing the module 100 and the auxiliary device. Thus, the module housing device 110 can be used to reduce the decrease in the battery performance.

The conductive member 18 according to the embodiment includes a base member 42 containing chromium, a first layer (covering layer 43) containing an oxide including zinc, and a zinc spinel portion 48 located at the interface 44 between the base member 42 and the first layer. The first layer includes a first region (region 431) and a second region (region 432). A first surface area ratio, at which the zinc spinel portion 48 located at a first interface (interface 441) between the first region and the base member 42 overlaps with the first interface, is less than a second surface area ratio, at which the zinc spinel portion 48 located at a second interface (interface 442) between a second region and the base member 42 overlaps with the second interface. This can reduce the performance decrease in the conductive member 18.

The embodiments disclosed herein should be considered exemplary in all respects and not restrictive. Indeed, the embodiments described above may be embodied in a variety of forms. The embodiments described above may be omitted, replaced, or modified in various forms without departing from the scope and spirit of the appended claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A cell stack device comprising:
at least one cell comprising an element portion; and
at least one conductive member comprising a base member containing chromium, a first layer containing an oxide containing zinc, and a zinc spinel portion located at an interface between the base member and the first layer, wherein
the first layer comprises a first region facing the element portion, and
a first overlap area ratio, at which the zinc spinel portion overlaps with a first interface located between the first region and the base member, is less than a second overlap area ratio at which the zinc spinel portion overlaps with a second interface located between the base member and a second region where the surface of the first layer is exposed to an oxidizing atmosphere.

2. The cell stack device according to claim 1, wherein the first overlap area ratio is 10 area % or more and 50 area % or less.

3. The cell stack device according to claim 1, wherein the base member contains chromium oxide and comprises a second layer located between the base member and the first layer.

4. The cell stack device according to claim 1, wherein the conductive member comprises a first part near an air inflow opening and a second part near an air outflow opening, and
an overlap area ratio, at which the zinc spinel portion overlaps with the interface, is greater at the second part than at the first part.

5. The cell stack device according to claim 1, wherein the conductive member comprises a first part near an air inflow opening and a second part near an air outflow opening, and
a thickness of the zinc spinel portion in a direction intersecting the interface is greater at the second part than at the first part.

6. A module comprising:
the cell stack device according to claim 1; and
a housing container configured to house the cell stack device.

7. A module housing device comprising:
the module according to claim 6;
an auxiliary device configured to operate the module; and
an external case configured to house the module and the auxiliary device.

8. A conductive member comprising;
a base member containing chromium;
a first layer containing an oxide containing zinc; and
a zinc spinel portion located at an interface between the base member and the first layer, wherein
the first layer comprises a first region and a second region, and
a first overlap area ratio, at which the zinc spinel portion overlaps with a first interface located between the first region and the base member, is less than a second overlap area ratio, at which the zinc spinel portion overlaps with a second interface located between the second region and the base member.

* * * * *